United States Patent [19]
Hanley

[11] Patent Number: 5,488,342
[45] Date of Patent: Jan. 30, 1996

[54] MAGNET ASSEMBLY FOR NMR

[75] Inventor: Peter Hanley, Forest of Dean, United Kingdom

[73] Assignee: Oxford Instruments Limited, Oxford, United Kingdom

[21] Appl. No.: 318,824

[22] PCT Filed: Feb. 7, 1994

[86] PCT No.: PCT/GB94/00226

§ 371 Date: Oct. 12, 1994

§ 102(e) Date: Oct. 12, 1994

[87] PCT Pub. No.: WO94/18577

PCT Pub. Date: Aug. 18, 1994

[30] Foreign Application Priority Data

Feb. 12, 1993 [GB] United Kingdom .................. 9302837

[51] Int. Cl.⁶ ............................ G01V 3/00; G01R 33/20; H01F 7/02
[52] U.S. Cl. ........................ 335/306; 335/301; 335/304; 324/319; 324/320; 324/303
[58] Field of Search ....................... 335/301, 302, 335/304, 306; 324/300, 303, 307, 318–320, 346

[56] References Cited

U.S. PATENT DOCUMENTS

| | | | |
|---|---|---|---|
| 4,350,955 | 9/1982 | Jackson et al. . | |
| 4,654,618 | 3/1987 | Leupold | 335/304 |
| 4,658,228 | 4/1987 | Leupold | 335/211 |
| 4,717,876 | 1/1988 | Masi et al. . | |
| 4,720,692 | 1/1988 | Jin | 333/144 |
| 4,810,986 | 3/1989 | Leupold | 335/301 |
| 5,095,271 | 3/1992 | Ohkawa . | |
| 5,162,770 | 11/1992 | Abele | 335/306 |

FOREIGN PATENT DOCUMENTS

| | | |
|---|---|---|
| 0371775A2 | 6/1990 | European Pat. Off. . |
| 0400922A1 | 12/1990 | European Pat. Off. . |
| 2112645 | 7/1983 | United Kingdom . |
| WO92/07279 | 4/1992 | WIPO . |

Primary Examiner—Michael W. Phillips
Assistant Examiner—Raymond M. Barrera

[57] ABSTRACT

A magnet assembly comprises a pair of substantially aligned, spaced apart first magnets (1,2) having like poles facing each other. A second magnet (3) is positioned adjacent the space between the first magnets with its magnetic axis transverse to the alignment axis of the first magnets (1,2). A magnetic field of sufficient homogeneity to perform a nuclear magnetic resonance process is generated in a working region.

19 Claims, 19 Drawing Sheets

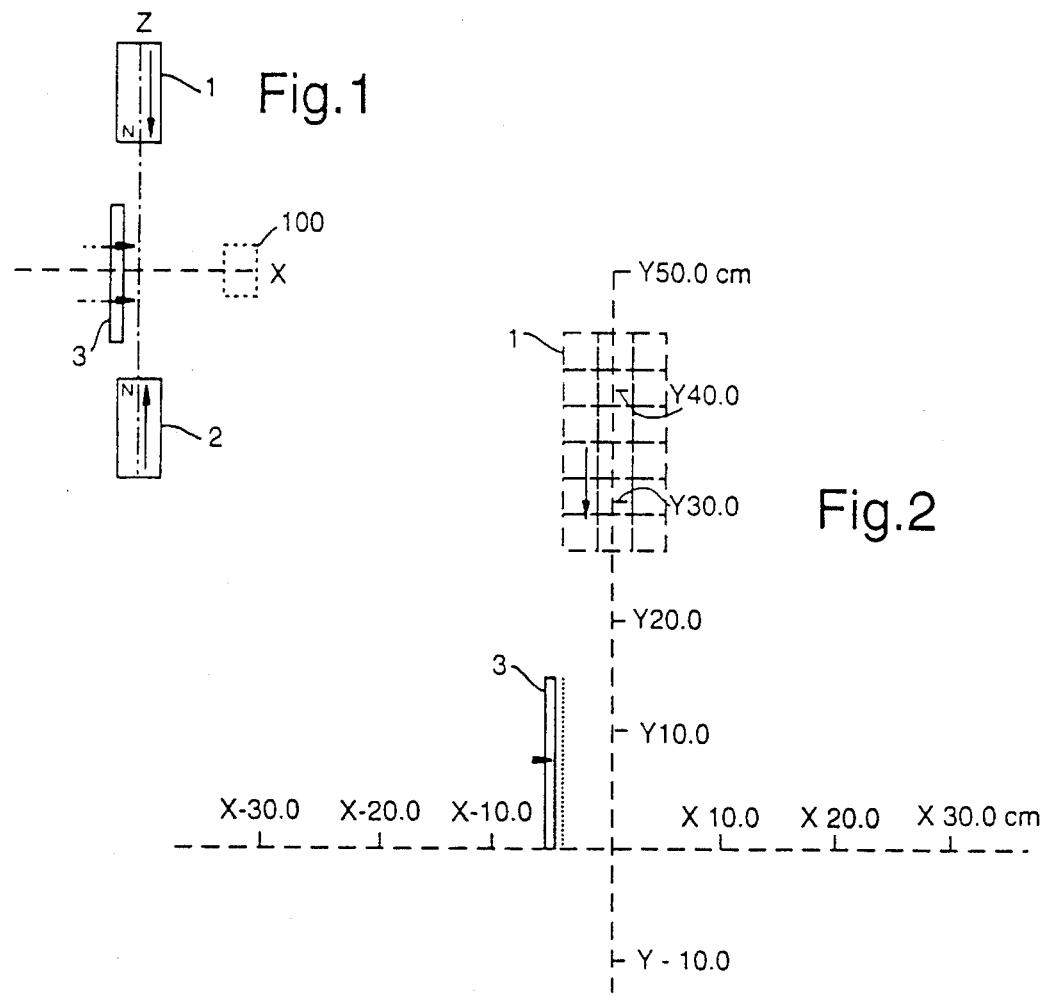
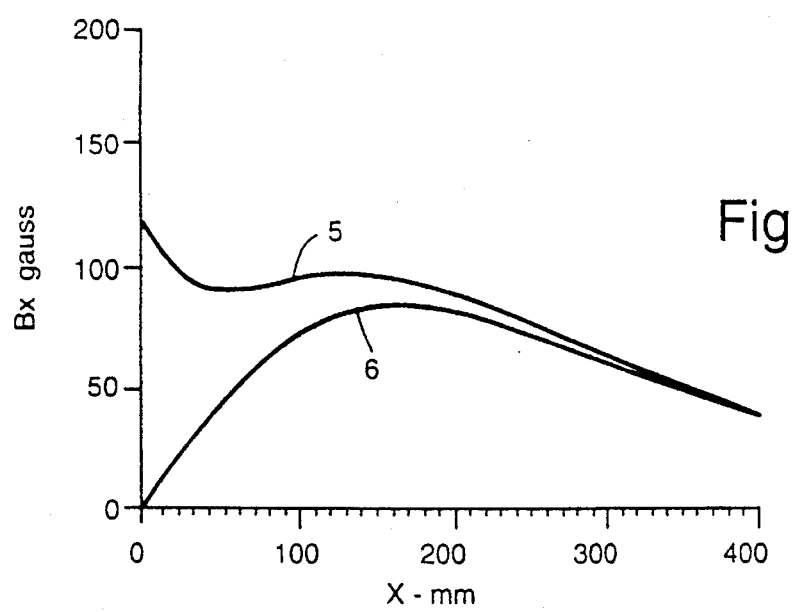

□ Y = 0 + Y = 2cm    ◇ Y = 4cm    △ Y = 6cm  X Y = 8cm    ▽ Y = 16cm

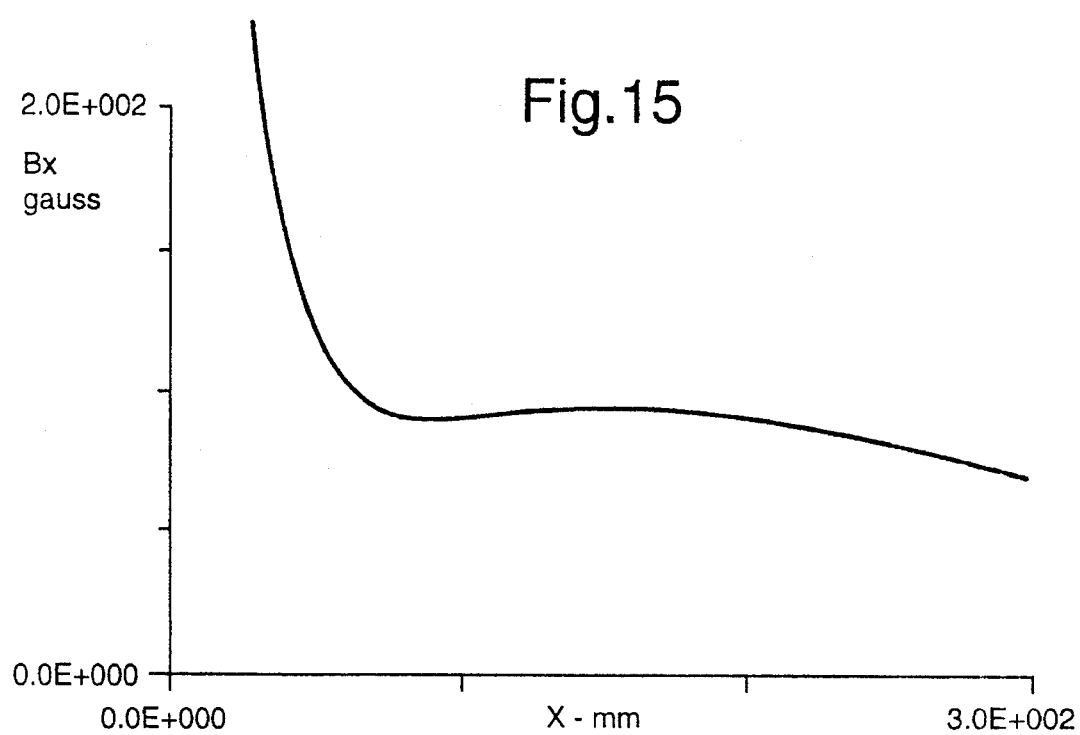
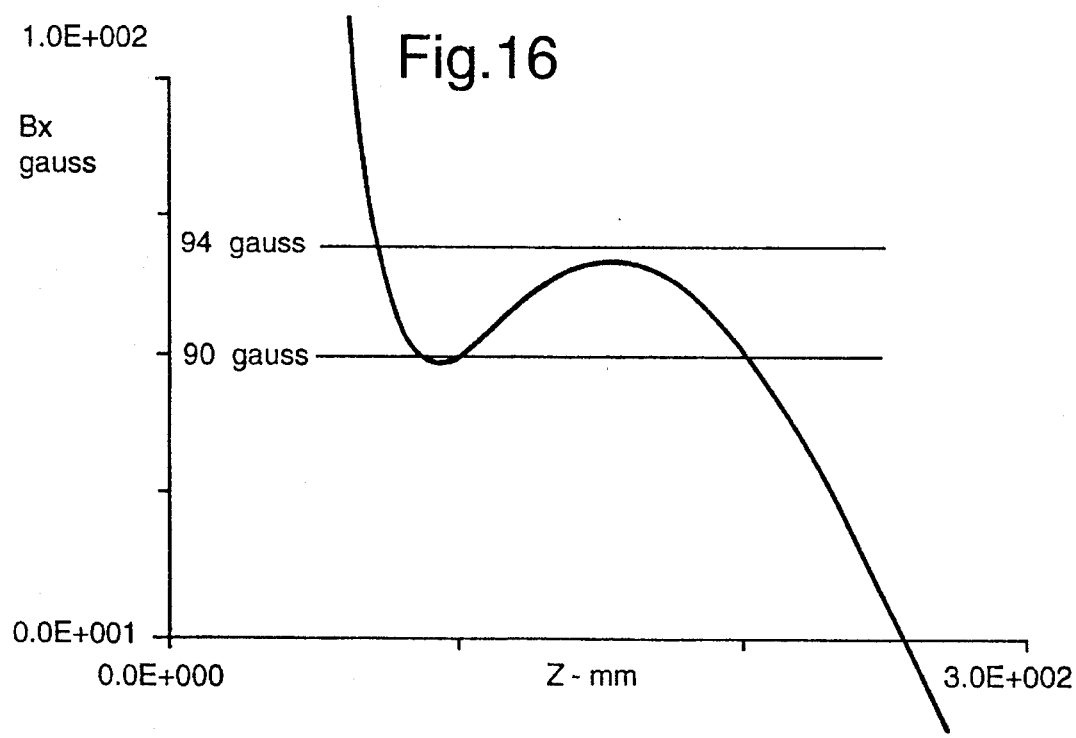

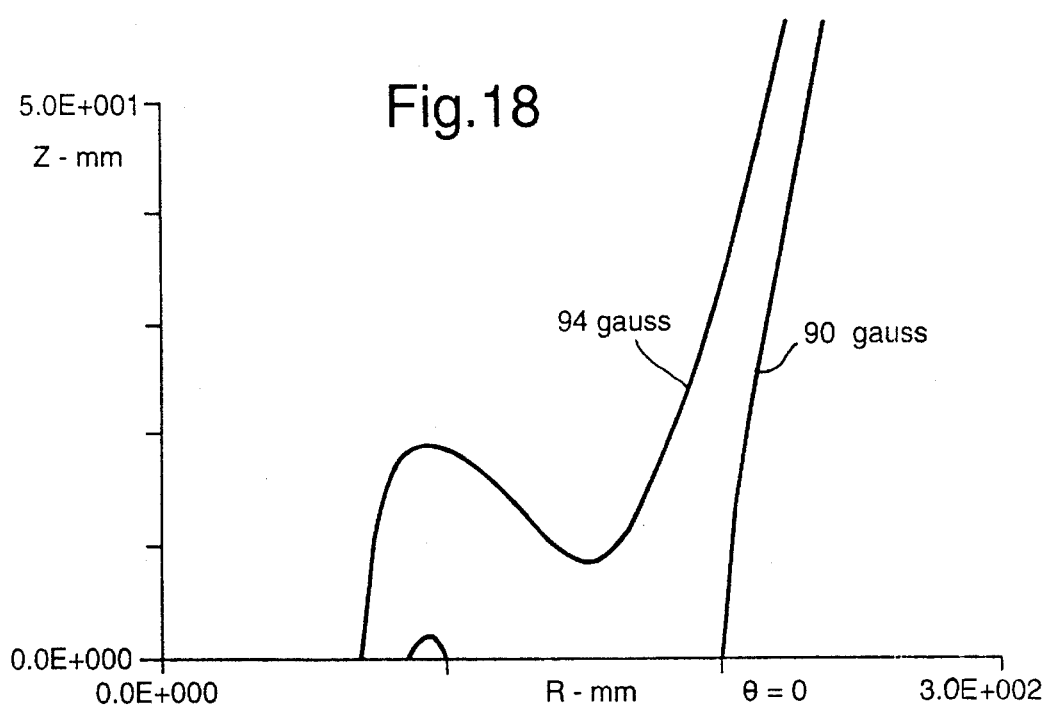
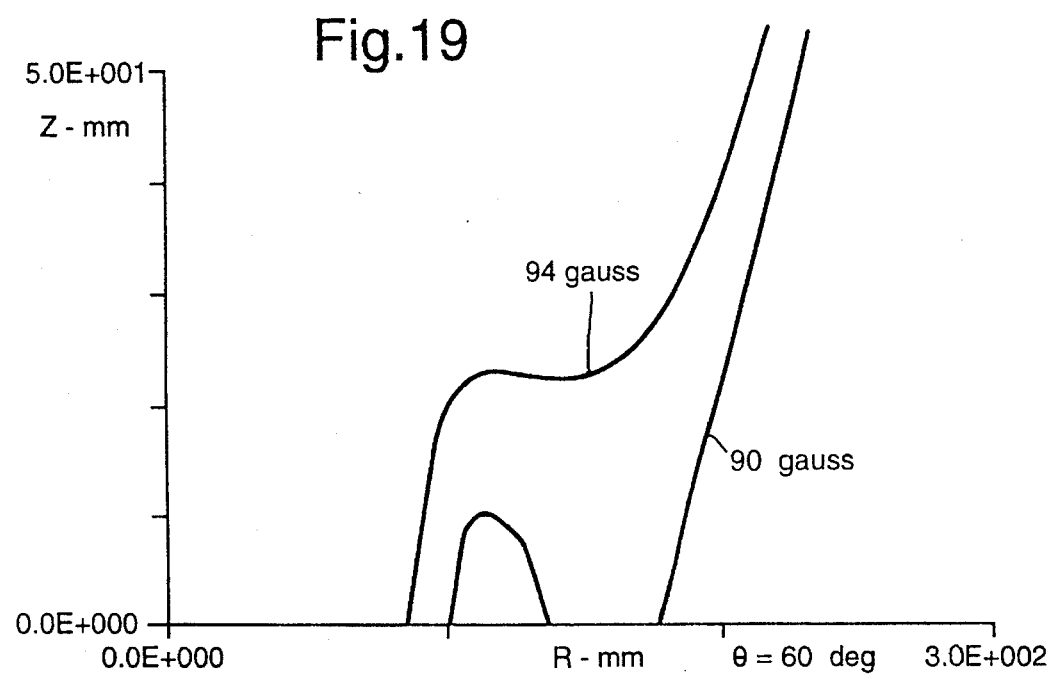

MAGNET ASSEMBLY FOR NMR

BACKGROUND OF THE INVENTION

1. Field of the Invention

The invention relates to a magnet assembly for generating a magnetic field of sufficient homogeneity to perform a NMR process in a working region.

2. Description of the Related Art

Magnet assemblies for generating homogeneous fields for the purposes of NMR are well known in a variety of fields but the present invention is particularly concerned, although not exclusively, with well logging applications. In these applications, the working region must be positioned outside the magnet assembly and in the surrounding rock in order to obtain NMR information from the rock. An early system of this type is described in U.S. Pat. No. 4,350,955.

In this arrangement, a pair of axially opposed magnets produce a radial field which has a maximum value and a region of uniformity over an annular volume whose radius is determined by the separation of the magnets. A variation on this scheme is described in WO-A-92/07279 whereby the volume of the homogeneous region is increased to improve the sensitivity of the NMR measurement.

These and similar systems are cylindrically symmetric. In some circumstances it may be desirable to deploy a well-logging instrument which takes the form of a "pad tool". These circumstances are, for example, when the size of the hole is much greater than the diameter of the tool, or when the hole is grossly irregular in section, and it is desired to exclude the response of the drilling fluid. Such a pad tool has been described in U.S. Pat. No. 4,933,638. The type of magnet system described in this has the drawback that the "throw" (i.e. the distance from the apparatus to the sensitive region) and the dimensions of the sensitive region have to be small compared to the dimensions of the magnet system in the transverse plane. This restricts the usefulness of this system.

SUMMARY OF THE INVENTION

In accordance with the present invention, a magnet assembly comprises a pair of substantially aligned, spaced apart first magnets having like poles facing each other; and a second magnet positioned adjacent the space between the first magnets with its magnetic axis transverse to the alignment axis of the first magnets whereby a magnetic field of sufficient homogeneity to perform a nuclear magnetic resonance (NMR) process is generated in a working region laterally offset from the first and second magnets.

We have devised a new magnet assembly which can generate a working region having a homogeneous magnetic field which is asymmetric relative to the magnet assembly and offset from the magnet assembly, the degree of offset being greater than has previously been possible while the lateral dimension of the working region is also greater than has previously been achieved.

Preferably, the second magnet is laterally offset from the alignment axis of the first magnets.

The second magnet could comprise a single magnet or a number of suitably positioned subsidiary magnets.

Typically, particularly for well-logging applications, the magnets comprise permanent magnets although electrical coils operating in a resistive or superconducting mode could also be used.

In one example, the boundary of the working region nearest to the magnet assembly is spaced by more than substantially 10 cm from the alignment axis of the first magnets. Preferably, also, the working region has a lateral dimension of at least 10 cm.

The invention also provides a NMR probe comprising a magnet assembly according to the invention; and a RF magnetic field generator for generating a substantially homogeneous RF magnetic field within the working region.

The RF magnetic field generator may be based on a conventional RF coil of the type described in U.S. Pat. No. 4,933,638 or as described in more detail below.

As has already been mentioned, the invention has particular application in the field of well logging. However, there are many other applications, including food monitoring in which the assembly is inserted into a storage silo or the like, or where, for example, the assembly is positioned to project the working region into the path of a conveyer, and magnetic resonance imaging of the human or animal body.

BRIEF DESCRIPTION OF THE DRAWINGS

Objects and advantages will become apparent and more readily appreciated from the following description of the preferred embodiments taken in conjunction with accompanying drawings of which:

FIG. 1 is a block diagram of a magnetic assembly in accordance with a first preferred embodiment of the present invention.

FIG. 2 is a graph of a finite-element model of a magnetic assembly in accordance with the first preferred embodiment of the present invention.

FIG. 6 is a graph of the field profile of a magnetic assembly in accordance with the first preferred embodiment of the present invention.

FIG. 15 is a graph of relevant field plots of a magnetic assembly in accordance with the second preferred embodiment of the present invention.

FIG. 16 is a graph of relevant field plots of a magnetic assembly in accordance with the second preferred embodiment of the present invention.

FIG. 18 is a graph of the field contours at a zero degree vertical plane of a magnetic assembly in accordance with the second preferred embodiment of the present invention.

FIG. 19 is a graph of the field contours at a sixty degree vertical plane of a magnetic assembly in accordance with the second preferred embodiment of the present invention.

DESCRIPTION OF THE PREFERRED EMBODIMENTS

Figure 3:
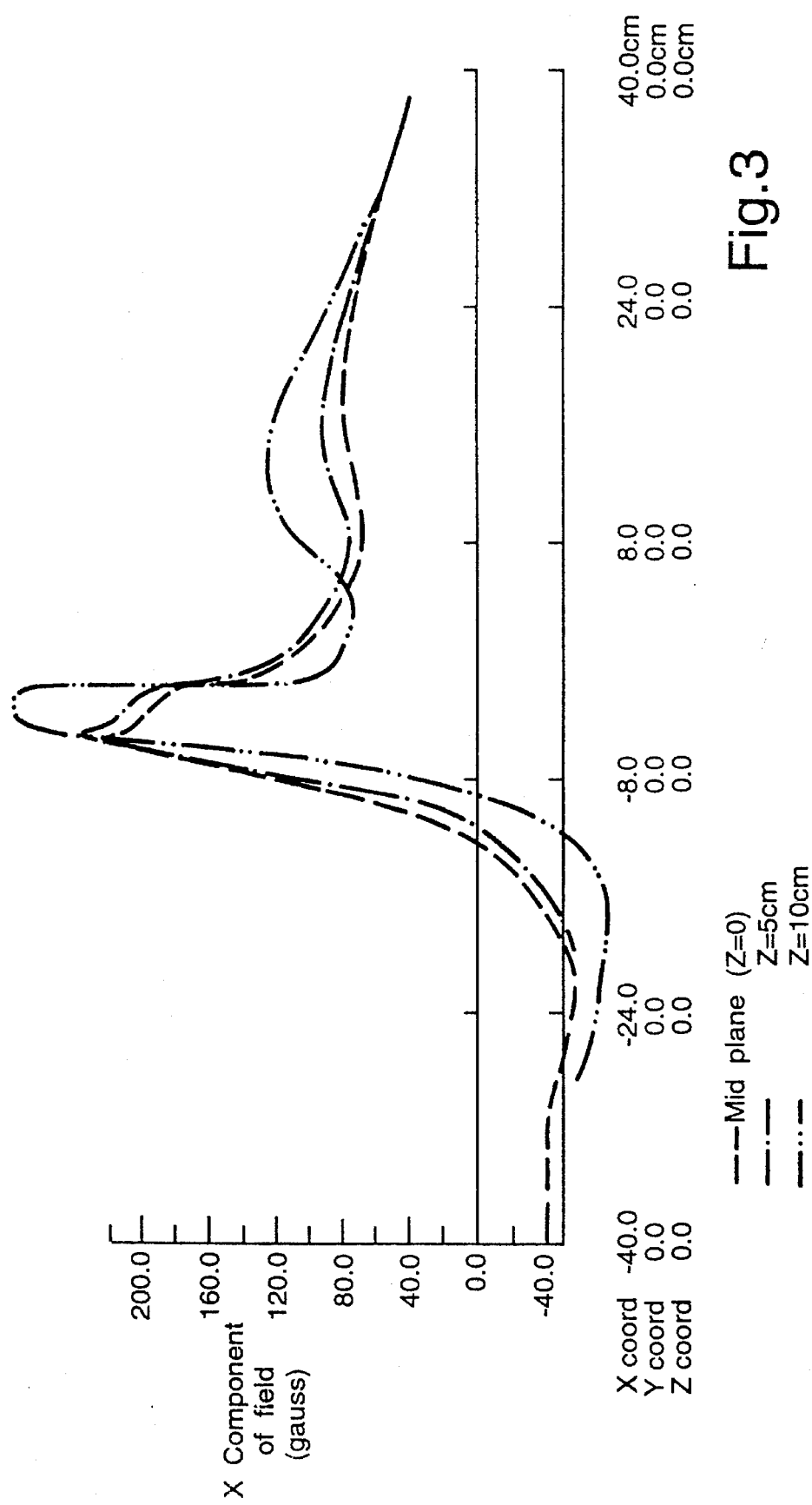
FIG. 3 is a graph o the field profiles of a magnetic assembly in accordance with the first preferred embodiment of the present invention.

Reference will now be made in detail to the present preferred embodiments of the present invention, examples of which are illustrated in the accompanying drawings, wherein like reference numerals refer to like elements throughout.

FIG. 1 illustrates schematically a magnet assembly comprising a pair of first permanent magnets 1,2 with their axes aligned on a Z axis and with their North poles facing each other and a planar second magnet 3 positioned about the X axis, offset laterally from the Z axis and with its North pole facing to the right (+x), as seen in FIG. 1.

The two main magnets 1,2 are magnetised in the positive and negative Z-directions, and by themselves would produce the usual annular sensitive region. The main magnets 1,2 may be of cylindrical or rectangular cross-section, and in this single-sided application a rectangular section with a front face shaped to conform to the side of the hole would be advantageous. In the following examples a rectangular section has been used.

The second compensating magnet 3 is slab shaped and magnetised in a direction perpendicular to the main magnets 1,2. It has two functions:

1: It provides a magnetomotive force which tends to direct the flux from the main magnets 1,2 in the forward X direction, reducing the field strength behind the magnet assembly.

2: By selecting its size and shape appropriately, it can counter the first and second order field gradients of the main magnets, thereby increasing the volume of the sensitive region.

When the magnet system is of limited extent in the Y direction (orthogonal to the XY plane and as in the example calculations below) a sensitive working region 100 is generated which is crescent shaped in the XY plane. If the magnets were to be extended to the Y direction, the sensitive region would consist of a bar lying parallel to the face of the magnet system.

Calculations

In producing the following example, a mixture of finite element calculations using software and closed-form calculations using current-sheet representations of magnetised blocks was used. The finite element calculations were used to determine the magnetisation and its distribution in the magnets, and the current-sheet representations were used to accurately calculate the field derivatives, and to rapidly try out many variations.

For the purposes of this example, two types of permanent magnet material were used: The main magnets 1,2 were assumed to be sintered Nd—Fe—B (type BRE35) and the compensating magnet 3 bonded Nd—Fe—B (type BRE10). The use of non-conducting material near the radio-frequency coil is desirable.

Figure 4:
FIG. 4 is a graph of the magnetisations of a main magnet in a magnetic assembly in accordance with the first preferred embodiment of the present invention.
Figure 5:
FIG. 5 is a graph of the magnetisations in a compensating magnet in a magnetic assembly in accordance with the first preferred embodiment of the present invention.

FIG. 2 shows a finite-element model (note that the Y and Z axes are interchanged in this model with respect to previous and subsequent description). The main magnets 1,2 are 10 cm square cross-section and 20 cm long. The field profiles are shown in FIG. 3, plotted in the mid plane and 5 and 10 cm above it. It can be seen that the field in the reverse direction is reduced, and in the forward X direction there is the required plateau region, although this is not optimised. FIGS. 4 and 5 show the magnetisations in the main 1 and compensating 3 magnets respectively at different X positions in the magnetic material, in order to illustrate that the blocks can be represented by current sheets without great loss of accuracy.

In the following calculations, the distributions of magnetisation were approximated to a uniform 11,900 gauss in the main magnets 1,2 and 5,900 gauss in the compensating magnet 3. This enabled the magnet blocks to be replaced by current sheets of current density $J=10$ M/$4\pi$ A/cm. These current sheets were then modelled by rectangular coils with 2 turns per cm for the main magnets, and 10 turns per cm for the compensating magnet.

FIG. 6 shows the field profile of the same model under this approximation, with 5 and without 6 the compensating magnet 3.

In order to design a system with the optimum volume of the sensitive region, we must evaluate the gradients due to the main magnets 1,2 at the centre of the sensitive region, and then seek a compensating magnet which balances these. Continuing with the same example, we tabulate the gradients of the main magnet at X=125 mm (See Table below).

The ratio of second order to first order gradients is $6.95 \times 10^{-3}/-2.222 \times 10^{-1} = -3.13 \times 10^{-2}$. We will now look for a compensating magnet with the same ratio of gradients, and then adjust its strength (by changing its thickness).

After several iterations, which should include a repeated finite element calculation to establish the value of magnetisation under the changed conditions, we arrive at a compensating element whose height (in the Z-direction) is 50 mm, thickness is 2.84 mm and X-position is 20.7 mm. The gradients due to this are tabulated below:

| FIELD DERIVATIVES Gauss Milimetres Degrees Partial derivatives w.r.t. X range 1.000E + 001 at X = 1.250E + 002, Y = 0.000E + 000, Z = 0.000E + 000 Gauss Millimetres Degrees | | | | |
|---|---|---|---|---|
| order | Bx | By | Bz | Bmod |
| 0 | −8.060E + 001 | 0.000E + 000 | 2.2220E − 015 | 8.060E + 001 |
| 1 | −2.22E − 001 | 0.000E + 000 | −9.476E − 015 | 2.222E − 001 |
| 2 | 6.950E − 003 | 0.000E + 000 | −1.588E − 014 | −6.950E − 003 |
| 3 | −4.017E − 005 | 0.000E + 000 | 1.377E − 014 | 4.017E − 005 |
| 4 | −4.449E − 006 | 0.000E + 000 | 2.958E − 014 | 4.449E − 006 |
| 5 | −2.946E − 007 | 0.000E + 000 | −8.784E − 015 | 2.946E − 007 |
| 6 | 3.203E − 006 | 0.000E + 000 | −2.598E − 014 | −3.203E − 006 |

Figure 7:
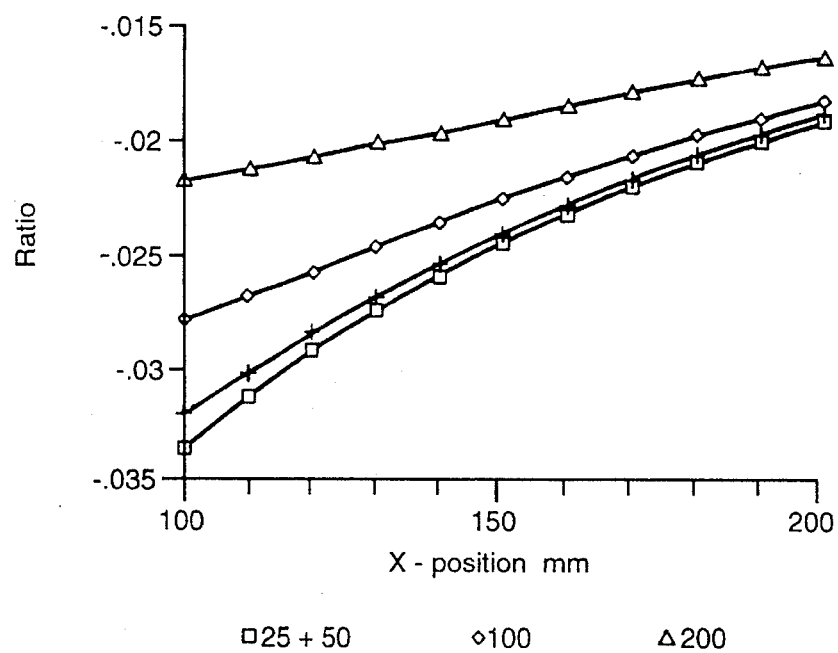
FIG. 7 is a graph of the ratio of gradience of a range of compensating magnets in a magnetic assembly in accordance with the first preferred embodiment of the present invention.

The ratio of gradients for a range of compensating magnets of different heights (25, 50, 100 and 200 mm respectively), and the same thickness, 5 mm is plotted against the magnet's X position in FIG. 7.

| FIELD DERIVATIVES Gauss Millimetres Degrees partial derivatives w.r.t. X range 1.000E + 001 at X = 1.250E + 002, Y = 0.000E + 000, Z = 0.000E + 000 Gaus Millimetres Degrees | | | | |
|---|---|---|---|---|
| order | Bx | By | Bz | Bmod |
| 0 | −9.111E + 000 | 0.000E + 000 | 0.000E + 000 | 9.111E + 000 |
| 1 | 2.224E − 001 | 0.000E + 000 | 0.000E + 000 | −2.224E − 001 |
| 2 | −6.957E − 003 | 0.000E + 000 | 0.000E + 000 | 6.957E − 003 |
| 3 | 2.615E − 004 | 0.000E + 000 | 0.000E + 000 | −2.615E − 004 |
| 4 | −1.211E − 005 | 0.000E + 000 | 0.000E + 000 | 1.211E − 005 |
| 5 | 3.687E − 007 | 0.000E + 000 | 0.000E + 000 | −3.687E − 007 |
| 6 | 8.013E − 007 | 0.000E + 000 | 0.000E + 000 | −8.013E − 007 |
| The complete system has therefore: | | | | |
| order | Bx | By | Bz | Bmod |
| 0 | −8.971E + 001 | 0.000E + 000 | 2.220E − 015 | 8.971E + 001 |
| 1 | 1.057E − 004 | 0.000E + 000 | −9.476E − 015 | −1.057E − 004 |
| 2 | −1.274E − 005 | 0.000E + 000 | −1.588E − 014 | 1.274E − 005 |

| | FIELD DERIVATIVES Gauss Millimetres Degrees partial derivatives w.r.t. X range 1.000E + 001 at X = 1.250E + 002, Y = 0.000E + 000, Z = 0.000E + 000 Gaus Millimetres Degrees | | | |
|---|---|---|---|---|
| 3 | 2.216E − 004 | 0.000E + 000 | 1.377E − 014 | −2.216E − 004 |
| 4 | −3.625E − 006 | 0.000E + 000 | 2.958E − 014 | 3.625E − 006 |
| 5 | −1.697E − 011 | 0.000E + 000 | −8.784E − 015 | 1.697E − 011 |
| 6 | −7.119E − 006 | 0.000E + 000 | −2.598E − 014 | 7.119E − 006 |

Figure 8:
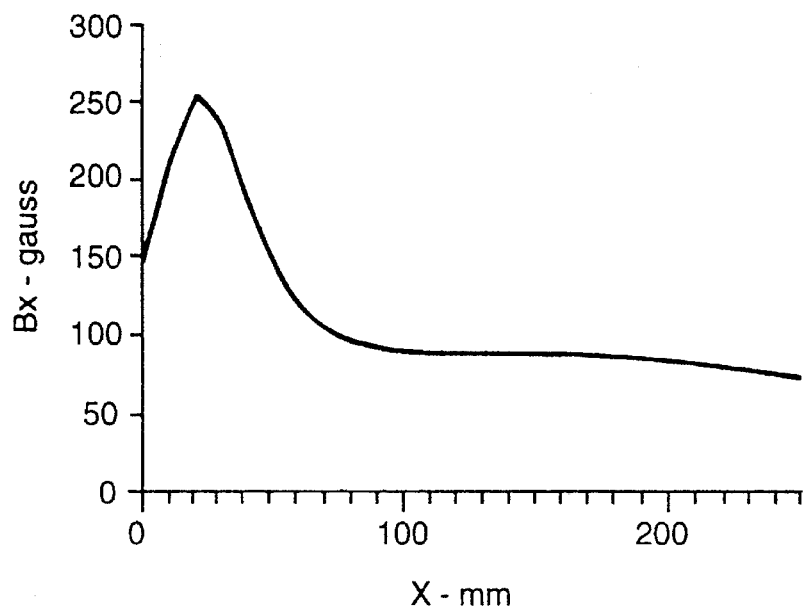
FIG. 8 is a field profile in the X-direction of a magnetic assembly in accordance with the first preferred embodiment of the present invention.
Figure 9:
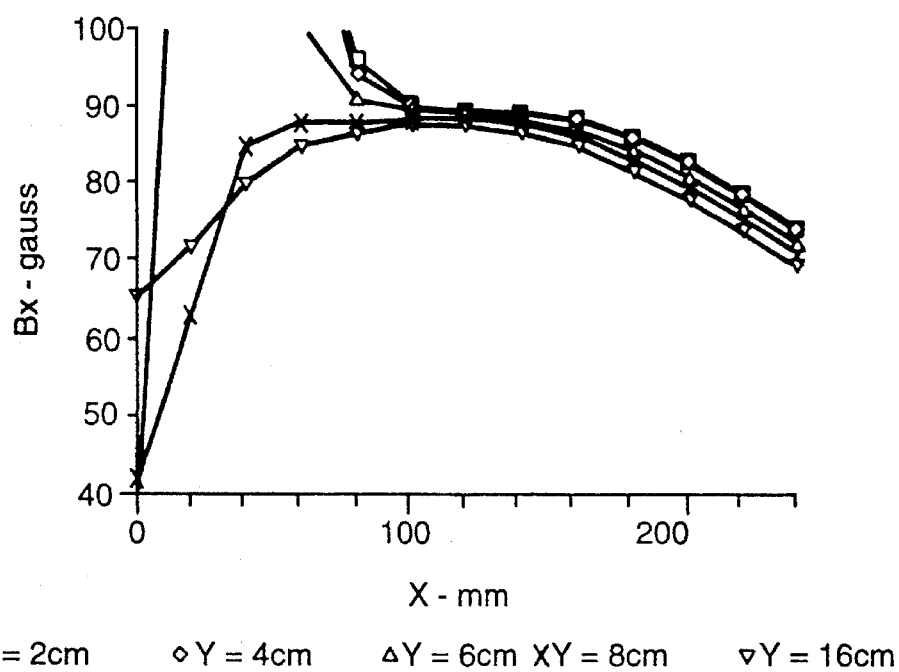
FIG. 9 is a graph of a stacked plot of the x profile at several different y positions of a magnetic assembly in accordance with the first preferred embodiment of the present invention.

The field profile in the X-direction is shown in FIG. 8, and FIG. 9 is a stacked plot of the X-profile at several different Y positions, illustrating that the sensitive region is crescent shaped in the XY plane.

Figure 10A:
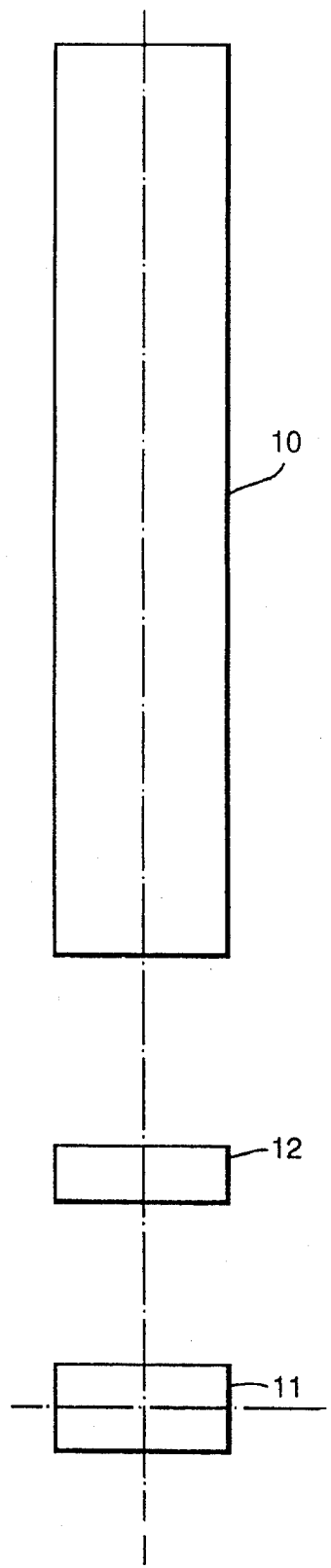
FIG. 10(A) is a block diagram of a magnetic assembly in accordance with a second preferred embodiment of the present invention.
Figure 10B:
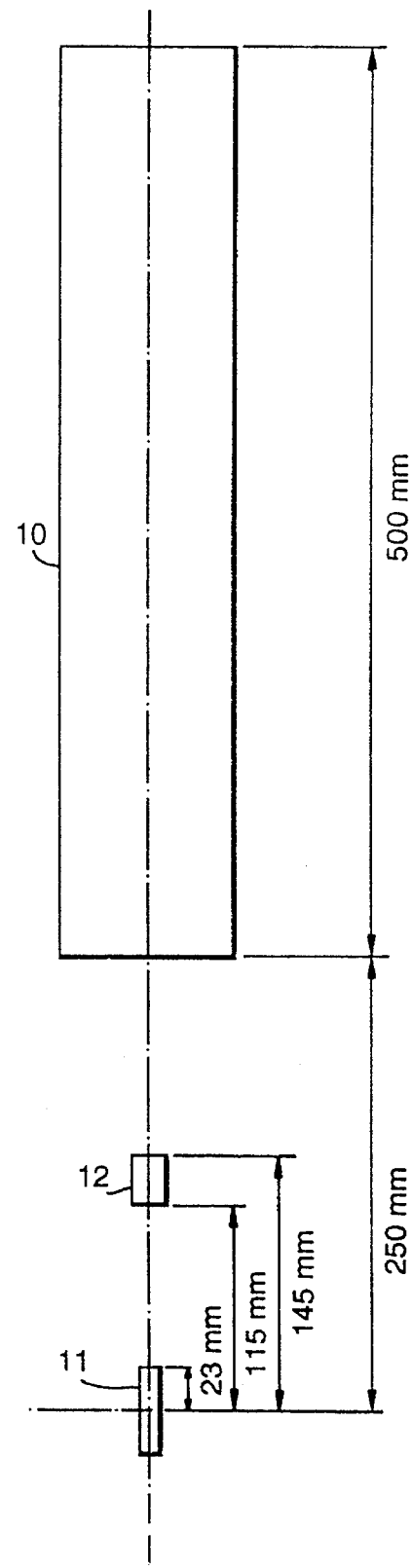
FIG. 10(B) is a block diagram of a magnetic assembly in accordance the second preferred embodiment of the present invention.
Figure 11:
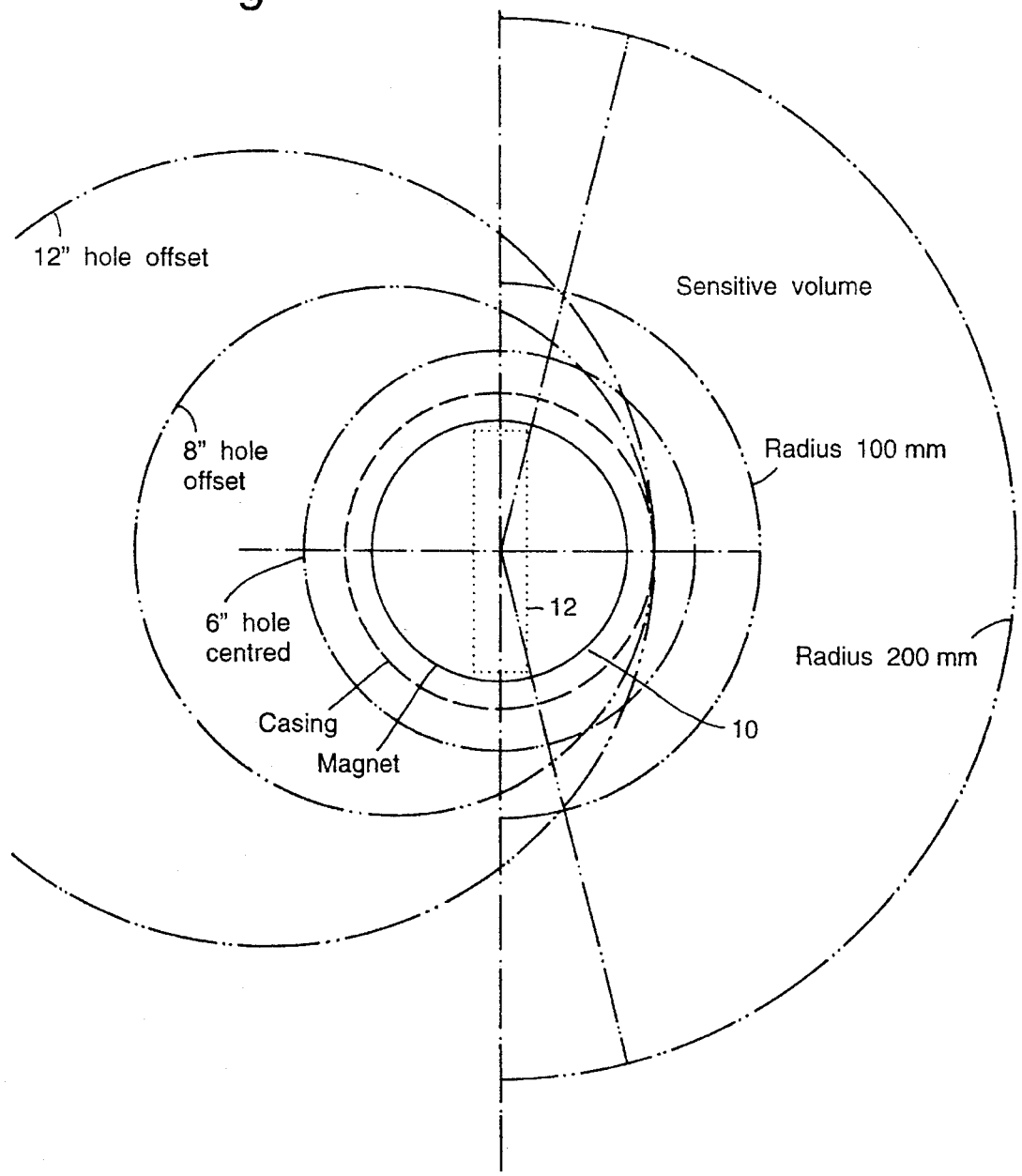
FIG. 11 is diagram of a magnetic assembly in accordance with the second preferred embodiment of the present invention illustrating the position of a working and sensitive volume for a variety of different diameter holes.

In the next example illustrated schematically in FIGS. 10A and 10B, a pair of permanent magnets 10–10', only one of which 10 is shown, are positioned substantially coaxially and spaced apart with three compensating magnets 11,12, 11', two of which 11,12 are shown, positioned symmetrically between them. FIG. 11 illustrates the tool shown in FIG. 10 when inserted into a variety of different diameter holes and also illustrates the position of the working, sensitive volume in each case. Effectively, the tool is shown centred in a 6 inch hole and radially offset from the central axis of an 8 inch hole and a 12 inch hole.

In calculations performed on this model, it was assumed that the main magnets 10 had a 100 mm diameter with a uniform magnetisation of 11000 gauss. The compensating magnets were assumed to have a uniform magnetisation of 3000 gauss (for example ferrite). The main magnets are magnetised axially in opposition, and the compensating magnets are magnetised transversely in a direction to aid the X-component of the field.

The above requirements imply that the sensitive volume should stretch from 100 mm from the centre line outwards. Aiming for a field strength of about 100 gauss sets the uncompensated maximum of the main magnets at a radius of 200 mm. The compensation system was therefore chosen to correct the gradients at 150 mm which are shown below:

whose strength is chosen so as to cancel the 2nd order gradient. By moving this block in the Z-direction the first order gradient can be adjusted.

Such a system and its gradients are shown below which for convenience substitutes current shells for the permanent magnets shown in FIG. 10.

| Magnet 10 | | | |
|---|---|---|---|
| Current | 9.750E + 002 | X | 0.000E + 000 |
| a1 | 5.000E + 001 | Y | 0.000E + 000 |
| a2 | 0.000E + 000 | Z | 0.000E + 000 |
| b1 | 2.500E + 002 | | |
| b2 | 7.500E + 002 | | |

| Magnet 10' | | | |
|---|---|---|---|
| Current | −9.750E + 002 | X | 0.000E + 000 |
| a1 | 5.000E + 001 | Y | 0.000E + 000 |
| a2 | 0.000E + 000 | Z | 0.000E + 000 |
| b1 | −7.500E + 002 | | |
| b2 | −2.500E + 002 | | | where current is in amps per millimeter length and the other parameters have these conventional meanings:

- $a_1$ (mm) is inner radius of a solenoid, or the radius of a hoop or current shell,
- $a_2$ (mm) is outer radius of a solenoid (not relevant to a hoop or shell),
- $b_1$ (mm) is distance (along the axis of symmetry) of the near end from the centre,

| | FIELD DERIVATIVES Gauss Millimetres Degrees partial derivatives w.r.t. X range 5.000E + 001 at X = 1.500E + 002, Y = 0.000E + 000, Z = 0.000E + 000 Gauss Millimetres Degrees | | | |
|---|---|---|---|---|
| order | Bx | By | Bz | Bmod |
| 0 | 8.490E + 001 | 0.000E + 000 | 0.000E + 000 | 8.490E + 001 |
| 1 | 1.152E − 001 | 0.000E + 000 | 0.000E + 000 | 1.152E − 001 |
| 2 | −5.240E − 003 | 0.000E + 000 | 0.000E + 000 | −5.240E − 003 |
| 3 | 5.604E − 005 | 0.000E + 000 | 0.000E + 000 | 5.604E − 005 |
| 4 | −2.057E − 004 | 0.000E + 000 | 0.000E + 000 | −2.057E − 004 |
| 5 | −1.901E − 005 | 0.000E + 000 | 0.000E + 000 | −1.901E − 005 |
| 6 | 6.834E − 004 | 0.000E + 000 | 0.000E + 000 | 6.834E − 004 |
| dB6 | 2.317E − 004 | 0.000E + 000 | 0.000E + 000 | |
| dBtotal | 2.718E − 001 | 0.000E + 000 | 0.000E + 000 | |

Figure 12:
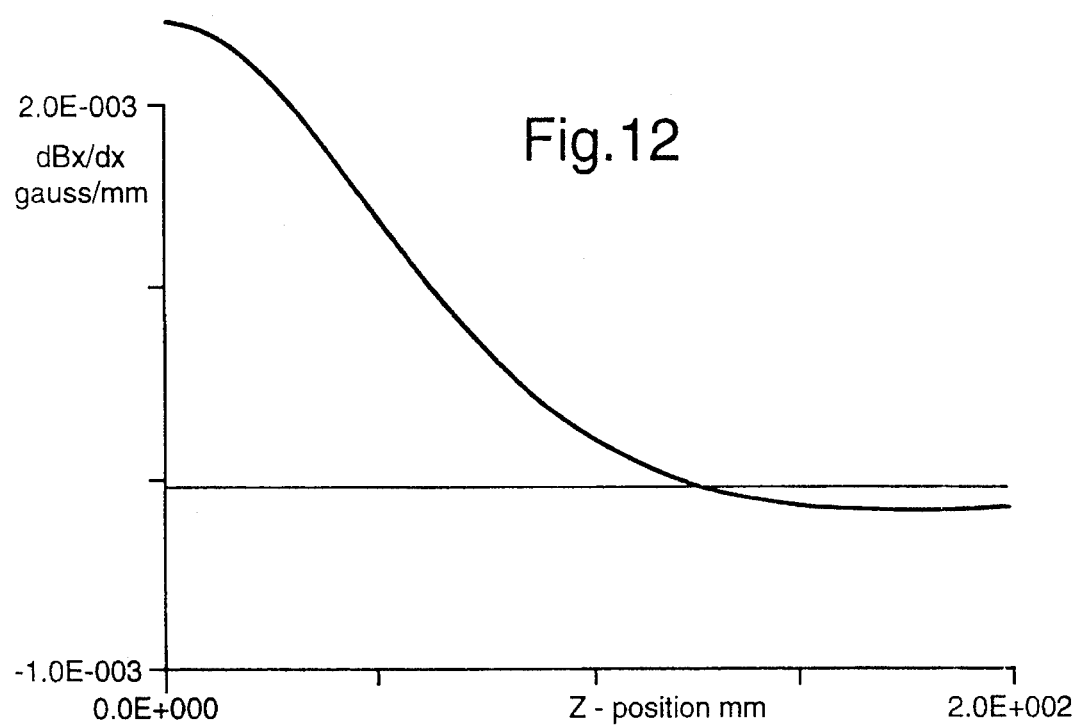
FIG. 12 is a chart of a first order gradient for a magnetic assembly in accordance with the second preferred embodiment of the present invention.
Figure 13:
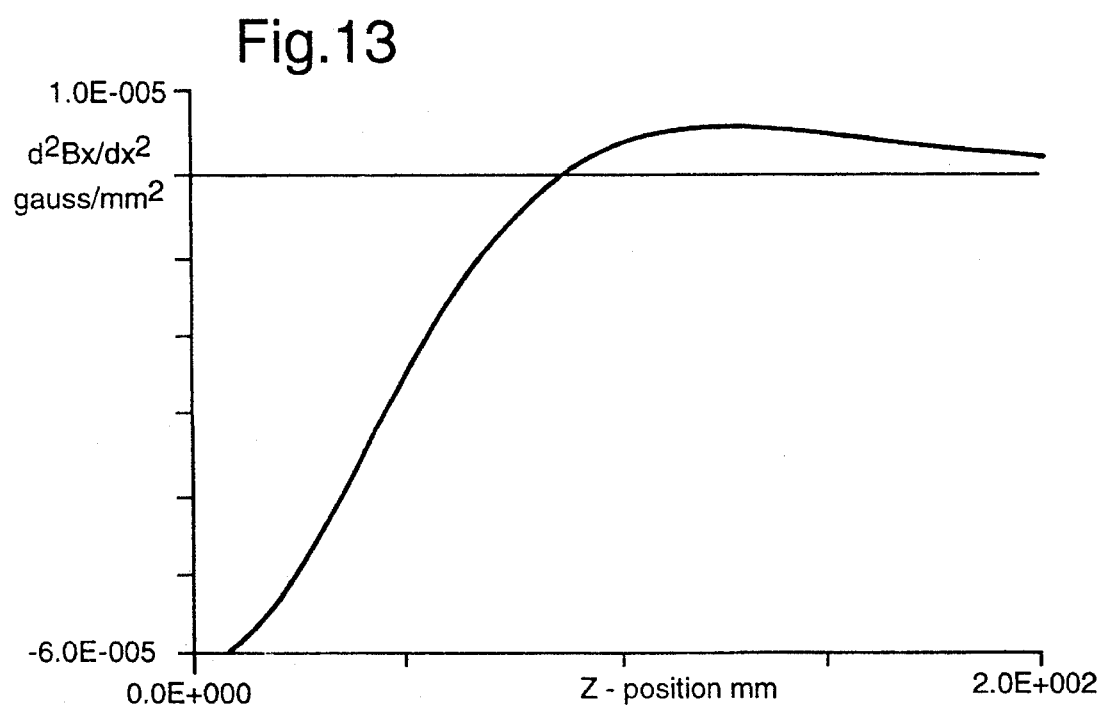
FIG. 13 is a graph of a second order gradient for a magnetic assembly in accordance with the second preferred embodiment of the present invention.

To illustrate the principle, FIGS. 12 and 13 show the first and second order gradients for a 1 mm thick by 10 mm high by 90 mm wide magnetised block, as a function of the axial (Z) position.

Figure 14:
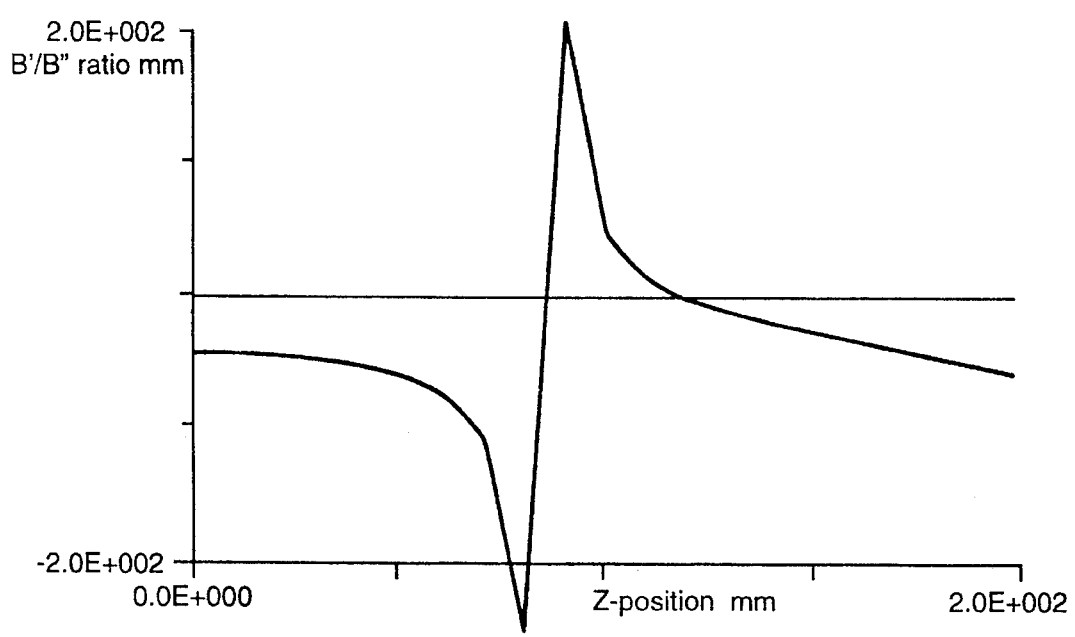
FIG. 14 is a graph of the ratio of the first and second order gradients of a magnetic assembly in accordance with the second preferred embodiment of the present invention.

FIG. 14 shows the ratio of these quantities.

By placing a magnet block centrally, the majority of the first order gradient and a large proportion of the second order may be cancelled. A pair of blocks is then placed near the Z-position where the first order gradient changes sign, and

- $b_2$ (mm) is distance (along the axis of symmetry) of the far end from the centre, and
- $X_i$, $Y_i$, $Z_i$ are the coordinates in a three-dimensional cartesian system of the ith corner of a straight sided coil ($0 < i < 5$).

These parameters will also be used in the Tables to follow.

coil 12

| | | | |
|---|---|---|---|
| Current | 5.320E + 003 amps | X3 | 0.000E + 000 |
| X1 | 0.000E + 000 | Y3 | 4.500E + 001 |
| Y1 | −4.500E + 001 | Z3 | −1.450E + 002 |
| Z1 | −1.150E + 002 | X4 | 0.000E + 000 |
| X2 | 0.000E + 000 | Y4 | 4.500E + 001 |
| Y2 | −4.500E + 001 | Z4 | −1.150E + 002 |
| Z2 | −1.450E + 002 | | | coil 12'

| | | | |
|---|---|---|---|
| Current | −5.320E + 003 amps | X3 | 0.000E + 000 |
| X1 | 0.000E + 000 | Y3 | 4.500E + 001 |
| Y1 | −4.500E + 001 | Z3 | 1.450E + 002 |
| Z1 | 1.150E + 002 | X4 | 0.000E + 000 |
| X2 | 0.000E + 000 | Y4 | 4.500E + 001 |
| Y2 | −4.500E + 001 | Z4 | 1.150E + 002 |
| Z2 | 1.450E + 002 | | | coil 11

| | | | |
|---|---|---|---|
| Current | −2.660E + 003 amps | X3 | 0.000E + 000 |
| X1 | 0.000E + 000 | Y3 | 4.500E + 001 |
| Y1 | −4.500E + 001 | Z3 | 2.300E + 001 |
| Z1 | −2.300E + 001 | X4 | 0.000E + 000 |
| X2 | 0.000E + 001 | Y4 | 4.500E + 001 |
| Y2 | −4.500E + 001 | Z4 | −2.300E + 001 |
| Z2 | 2.300E + 001 | | |

FIELD DERIVATIVES Gauss Millimetres Degrees
partial derivatives w.r.t. X range 5.000E + 001
at X = 1.500E + 002, Y = 0.000E + 000, Z = 0.000E + 000
Gauss Millimetres Degrees

| order | Bx | By | Bz | Bmod |
|---|---|---|---|---|
| 0 | 9.326E + 001 | 0.000E + 000 | 0.000E + 000 | 9.326E + 001 |
| 1 | 1.282E − 002 | 0.000E + 000 | 0.000E + 000 | 1.282E − 002 |
| 2 | −3.333E − 003 | 0.000E + 000 | 0.000E + 000 | −3.333E − 003 |
| 3 | −3.296E − 006 | 0.000E + 000 | 0.000E + 000 | −3.296E − 006 |
| 4 | −1.371E − 004 | 0.000E + 000 | 0.000E + 000 | −1.371E − 004 |
| 5 | −1.899E − 005 | 0.000E + 000 | 0.000E + 000 | −1.899E − 005 |
| 6 | 5.012E − 004 | 0.000E + 000 | 0.000E + 000 | 5.012E − 004 |
| dB6 | 1.699E − 004 | 0.000E + 000 | 0.000E + 000 | |
| dBtotal | 2.155E − 002 | 0.000E + 000 | 0.000E + 000 | |

The cancellation in this example is not perfect, but it should be noted that partial 3rd order cancellation is achieved, and over the large distances (±50 mm) of interest, it is in fact the third order which dominates. Better cancellation would require a stronger pair of adjustment elements. Realistic design would require iterations with a finite-element calculation to establish the "real" magnetisations and their distribution.

Even so, this model produces a sensitive volume 100 which extends from 100 mm to 200 mm if one allows for a field excursion of ±2 gauss. The relevant field plots are shown in FIGS. 15 and 16.

Figure 17:
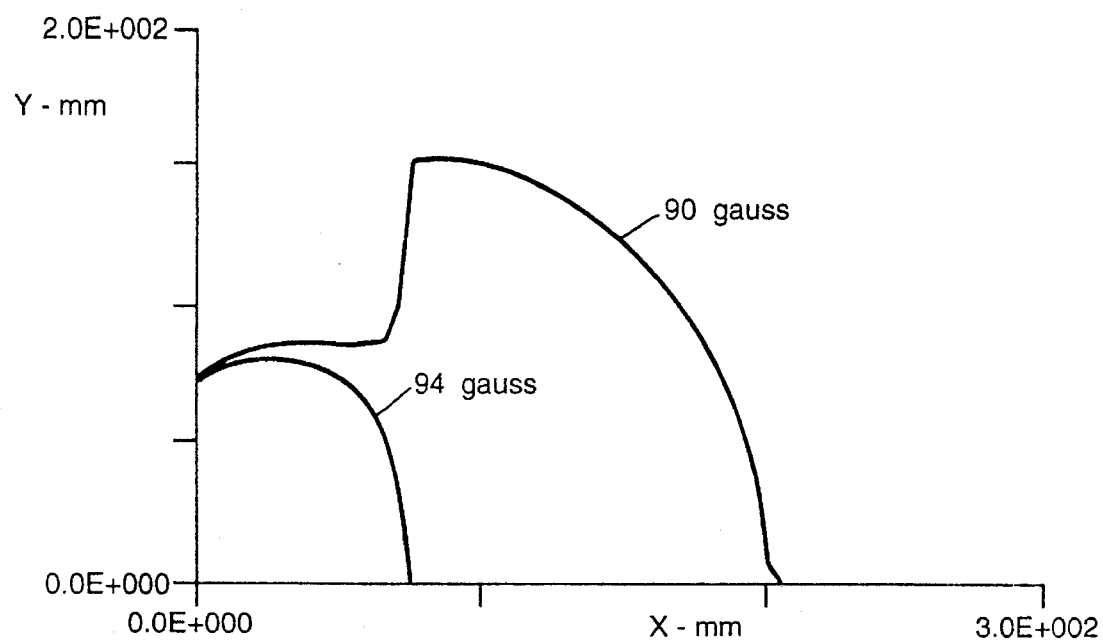
FIG. 17 is a graph of the sensitive volume in the horizontal mid-plane of a magnetic assembly in accordance with the second preferred embodiment, of the present invention.

The dimensions of the sensitive volume 100 in the horizontal mid-plane are illustrated in FIG. 17.

It can be seen that this has the required dimensions, and is substantially larger than the magnet system producing it.

Figure 20:
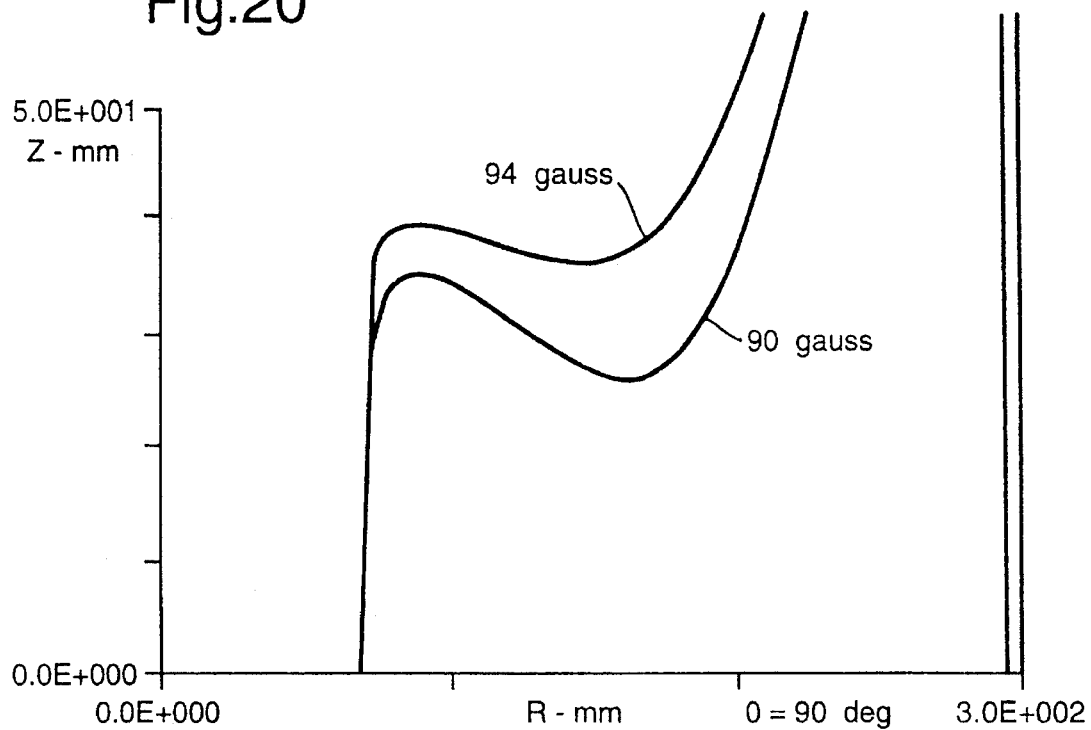
FIG. 20 is a graph of the field contours at a ninety degree vertical plane of a magnetic assembly in accordance with the second preferred embodiment of the present invention.

The shape of the sensitive volume 100 in the vertical direction is illustrated in FIGS. 18, 19 and 20. These are in a cylindrical polar coordinate system, and show the field contours in different vertical planes at angles of 0°, 60° and 90° to the X-direction.

From these, we estimate the sensitive volume 100 at about 1.4 liters, which compares very favourably with the cylindrically-symmetric designs studied to date (which typically have 3 liters). Provided that sufficient directionality of both the transmitter coil (to reduce eddy-current losses in the borehole fluid) and the receiver coil (to eliminate noise originating in the borehole) there should be no loss of sensitivity. Indeed, there should be an improvement due to the closer distance from the receiver coil to the sensitive volume which comes from offsetting the device.

So far, we have only described the magnet assembly while in a well logging probe it is also necessary to provide one or more RF field generators in order to carry out a NMR experiment.

It is preferable if the RF field generator generates an RF field which is offset in a similar way to the main field as described above. Furthermore, the objective is to design a coil arrangement which produces a relatively uniform $B_1$ field over the working volume (ie that volume where the $B_0$ field due to the magnets is close to the value required for resonance).

Figure 21:
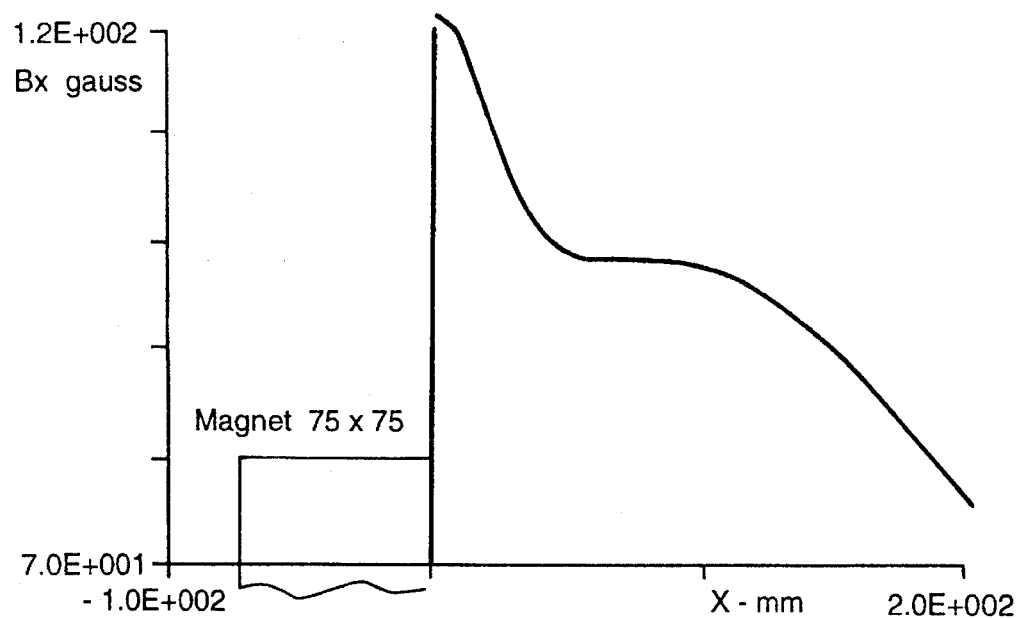
FIG. 21 is a graph of a field profile of a magnetic assembly in accordance with a preferred embodiment of the present invention.

Consider, for example, an arrangement based on the FIG. 1 configuration in which each of the magnets 1,2 is 75 mm square, the magnets being separated by 400 mm in the Z-direction and magnetised in opposition. The field gradients in the region of X=70 mm are corrected by the compensating magnet 3 magnetised in the X-direction. The resulting field profile is shown in FIG. 21.

To design a matching transmitter coil we must satisfy the requirements that the $B_1$ field is perpendicular to $B_0$ and that its first derivative is zero at X=70 mm. A current filament in the Y direction will produce a field in the Z direction, so we examine the gradients of such a filament, 75 mm long, as a function of its Z position.

Figure 22:
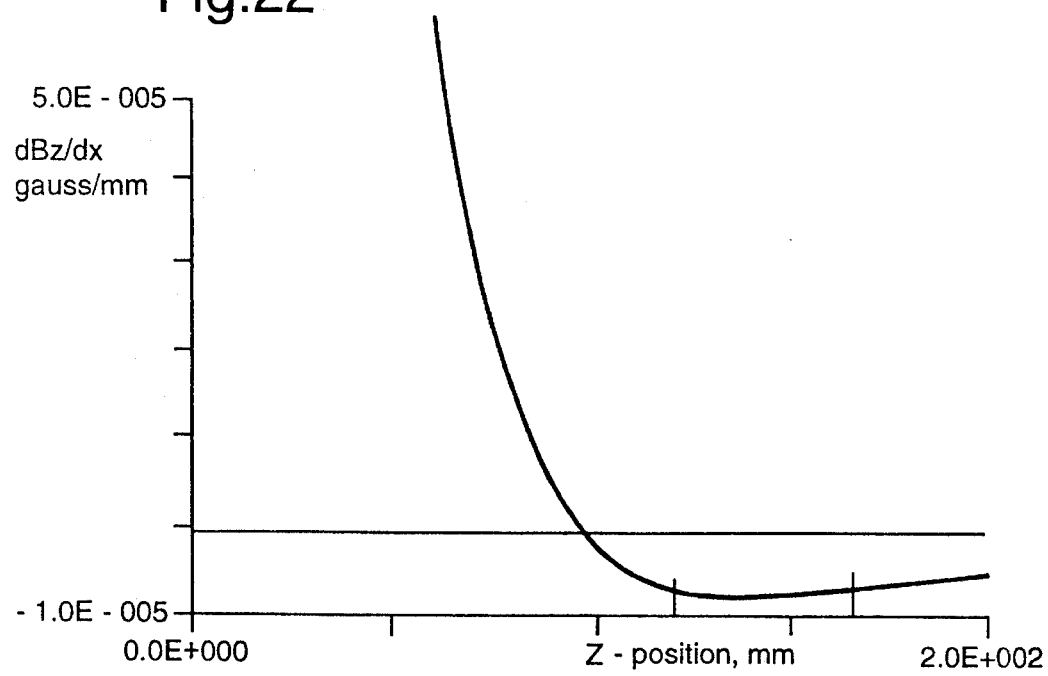
FIG. 22 is a graph of a field profile of a magnetic assembly in accordance with a preferred embodiment of the present invention.

The variation of dBz/dx at X=70 mm is shown in FIG. 22 showing that conductors placed at Z=120 mm and Z=165 mm have equal gradients.

Figure 23:
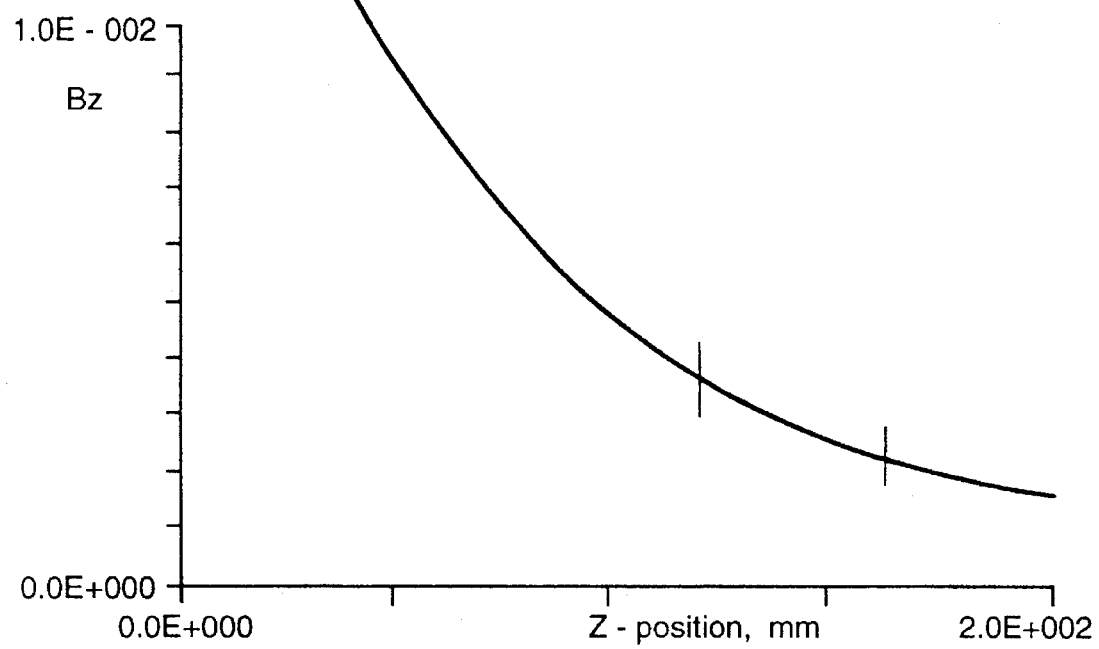
FIG. 23 is a graph of a field profile of a magnetic assembly in accordance with a preferred embodiment of the present invention.

By placing a pair of filaments at Z=120 mm and 165 mm and arranging them as opposite sides of a rectangular coil so that their currents flow in opposite directions, their first order gradients can be seen to cancel. The zero-order terms do not cancel however, as can be seen from FIG. 23.

Figure 24:
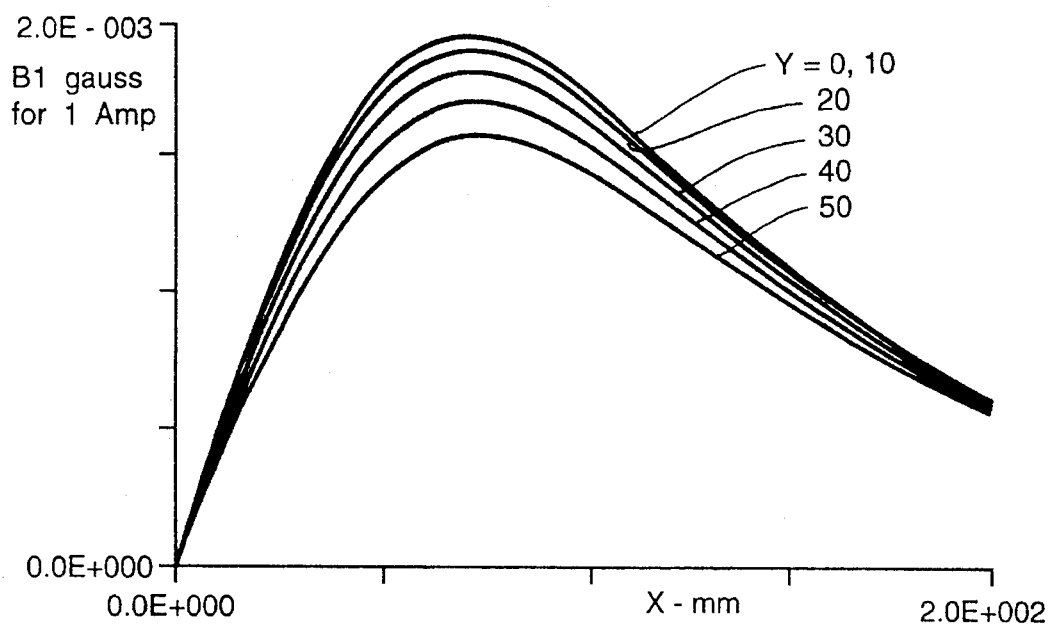
FIG. 24 is a graph of a field profile for the magnetic assembly shown in FIG. 31 where z=0.
Figure 25:
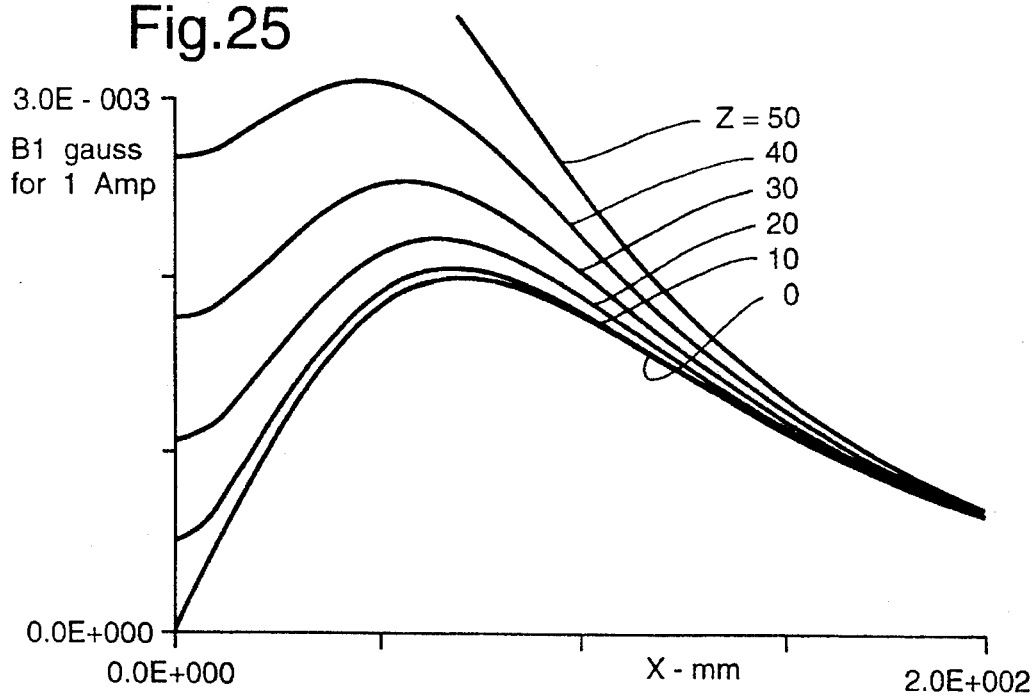
FIG. 25 is a graph of a field profile of the magnetic assembly shown in FIG. 31 where y=0.
Figure 31:
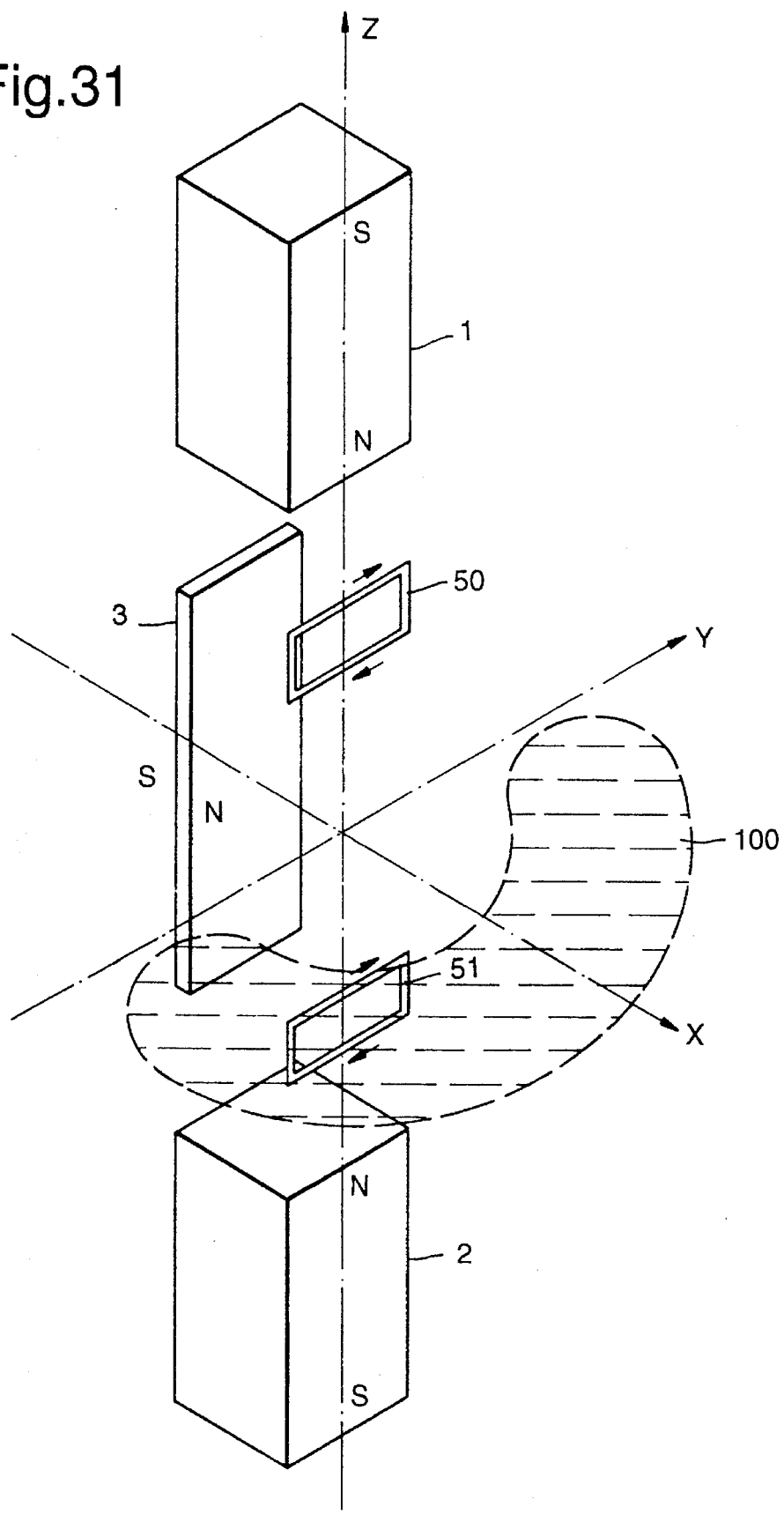
FIG. 31 is a block diagram of a magnetic assembly in accordance with a preferred embodiment of the present invention.

The practical arrangement, shown in FIG. 31, consists of a pair of such coils (50,51), symmetrically placed about the XY plane, and thereby producing only a Z component of field at the required point within working region 100. The field profiles for this coil system are shown in FIGS. 24 (where Z=0) and 25 (where Y=0).

Figure 26:
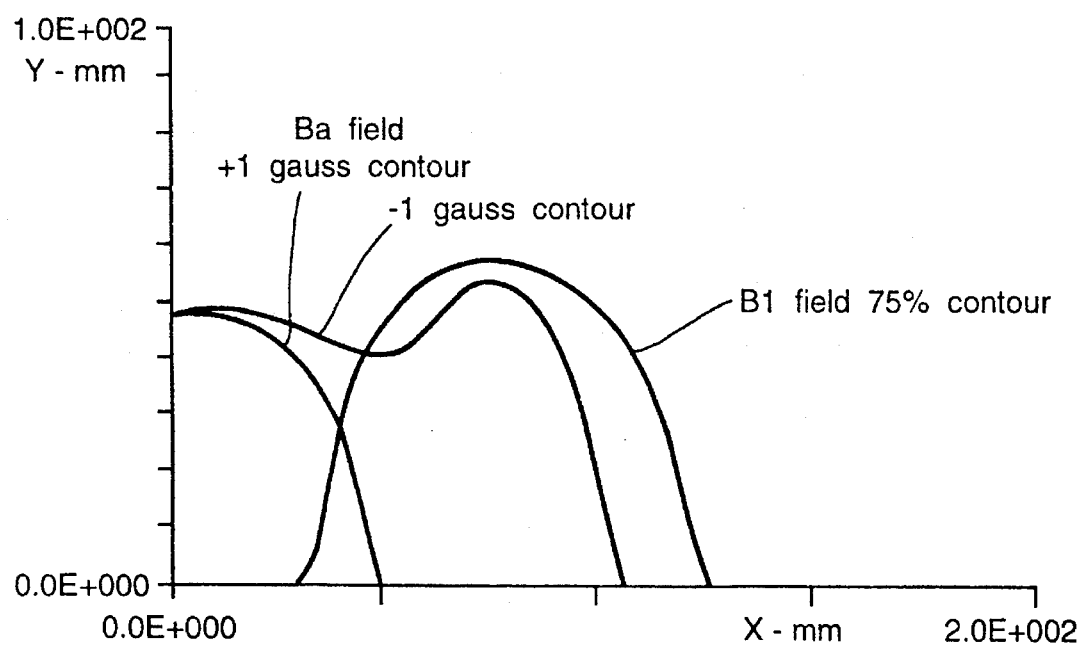
FIG. 26 is a graph of a field profile of the magnetic assembly shown in FIG. 31 as described by a 75% contour line.

FIG. 26 shows that the field profile of the coil, as described by its 75% contour line, matches the size and shape of the sensitive volume as described by the ±1 gauss $B_0$ contours.

It has been shown that the dominant loss mechanism for this size of system, at the working frequencies envisaged, is likely to be due to coupling with the surroundings. In order to minimise this, it is desirable to make the RF coil directional and to minimise the size of the coil.

Figure 27:
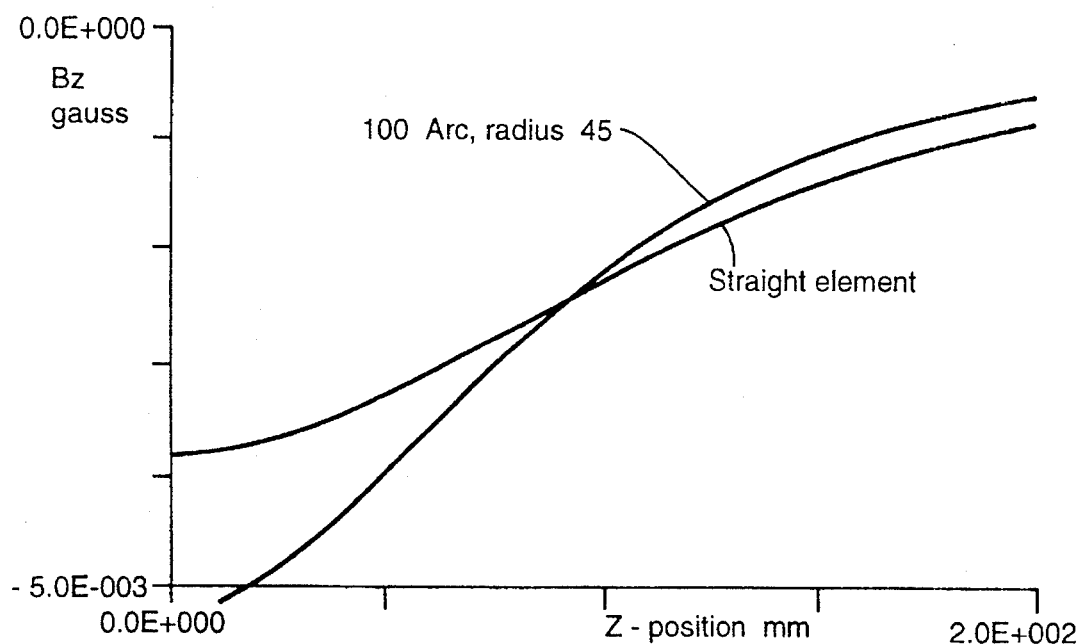
FIG. 27 is a graph showing Bz for a conductor element for use in a magnetic assembly in accordance with a preferred embodiment of the present invention.
Figure 28:
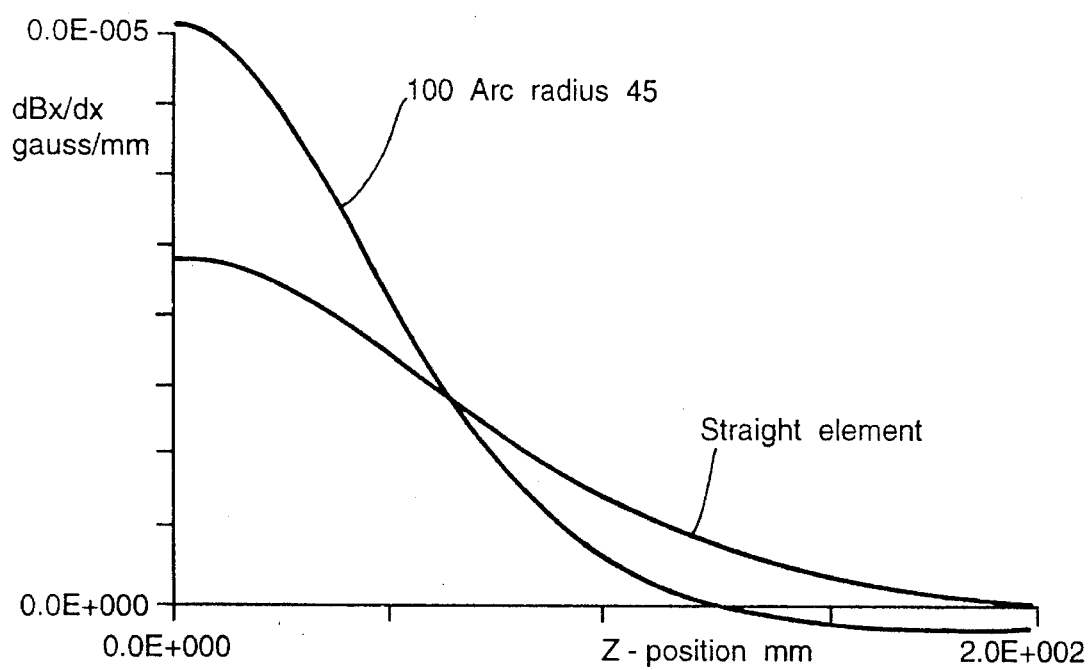
FIG. 28 is a graph showing dBz/dx for a conductor element for use in a magnetic assembly in accordance with a preferred embodiment of the present invention.
Figure 29:
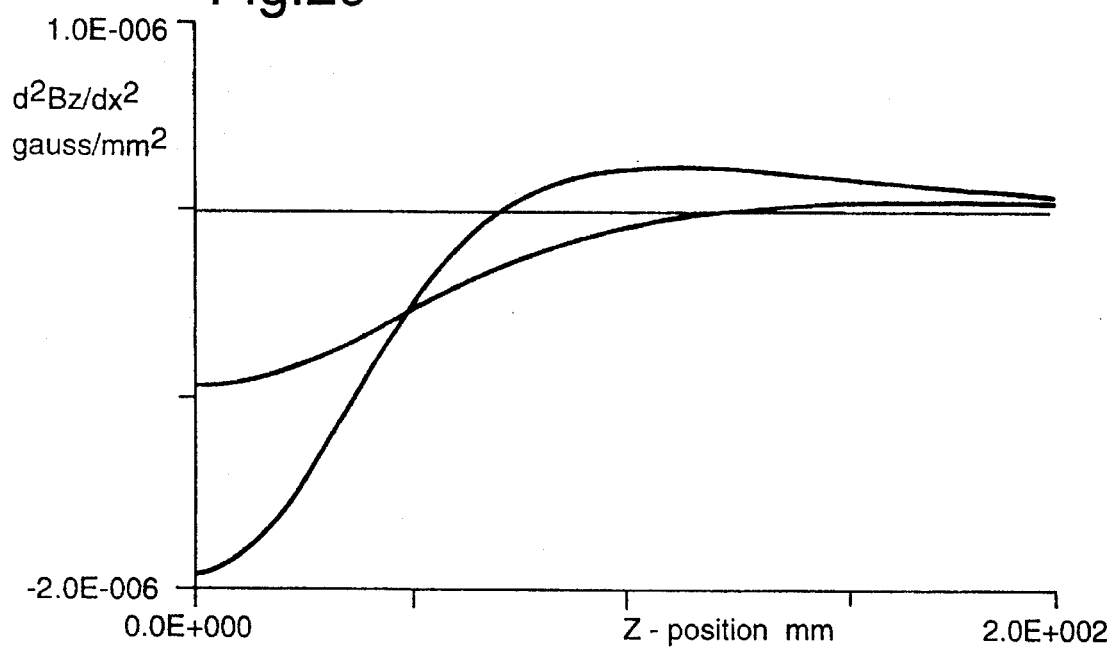
FIG. 29 is a graph showing $d^2Bz/dx^2$ for a conductor element for use in a magnetic assembly in accordance with a preferred embodiment of the present invention.

We have examined coils consisting of combinations of 180° arcs on the front face (radius 45 mm) and straight filaments across a diameter. This allows the rear face to have a semi-cylindrical screen (to achieve directionality) which is relatively loosely coupled and at the same time provides a flux return path between the coil and the screen. Considering first the unscreened case, FIGS. 27, 28 and 29 show the Bz, dBz/dx and $d^2Bz/dx^2$ for these two types of conductor element at X=150 mm as a function of the Z-position of the element.

It can be seen that there are several possibilities for cancelling gradients. The one chosen is that which gives the shortest coil compatible with a reasonable field strength and also sufficient coverage of the sensitive volume.

Figure 30:
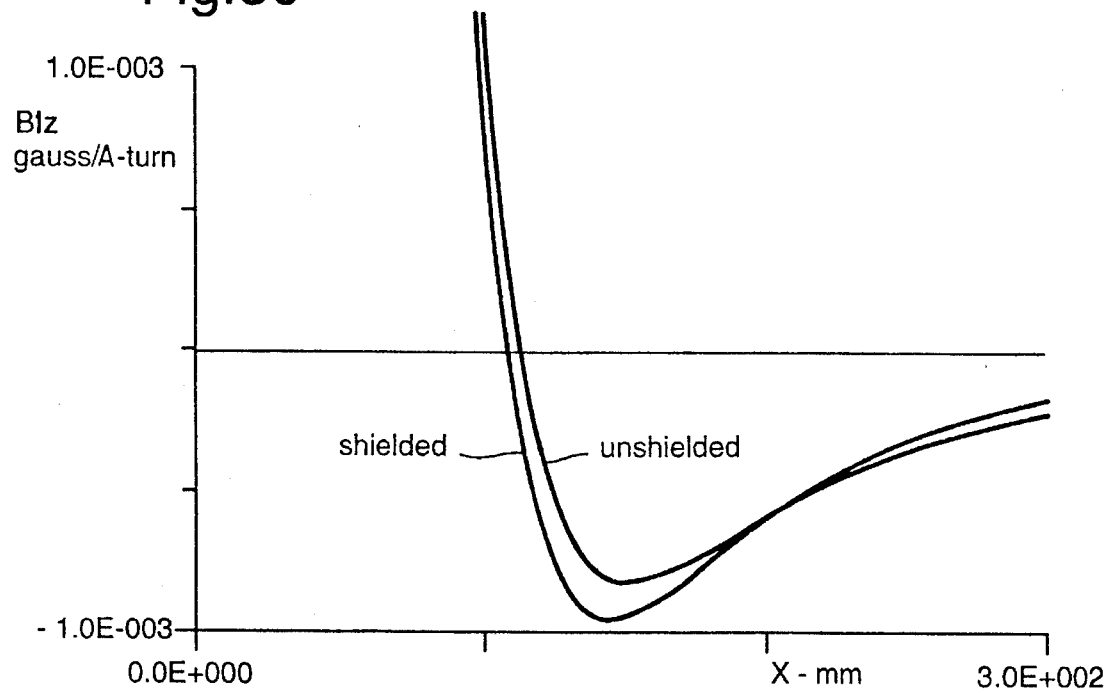
FIG. 30 is a graph of the x profile of Bz, with and without screening of a conductor element, for use in a magnetic assembly in accordance with a preferred embodiment of the present invention.

With both elements at Z=64 mm, the first order gradients cancel exactly. Unfortunately, the remaining second order gradient is too big to allow full coverage of the sensitive volume—the coverage is from 125 to 190 mm instead of 100 to 200. (See FIG. 30). Further optimisation is possible because it is not necessary to have both elements at the same Z-position: they can be joined by short wires in the axial direction.

In order to model the effect of a screen, this was assumed to be semi-cylindrical and was represented by the images of the conductors in it. The effect of this can be seen in FIG. 30 which shows the X-profile of Bz with and without screening (shielding). It can be seen that the screening is beneficial.

Similar considerations apply in the case of a receiver coil. We want the best coupling with the sensitive volume, although we are less interested in uniformity, and we want to minimise the coupling with the rest of the world. This is to optimise signal-to-noise ratio rather than power consumption, although the consequences are the same.

In the single-sided case we have rather more options open than in the cylindrically symmetric geometry. These options are:

1. Same coil for receive and transmit;
2. Co- or parallel-axial coils with decoupling being obtained by systems of diodes as we have done previously;
3. Crossed coils.— This is a new possibility opened up with a single-sided system.

While the conductivity of the surroundings dominates the noise, the Figure of merit for a receiver coil is related to:

$$\frac{\int_{\text{sensitivevol}} B_1 dV}{\int_{\text{allspace}} B_{mod} dV}$$

Where B is the notional field produced per unit current in the coil, $B_1$ is its component perpendicular to the $B_0$ field (representative of the NMR signal) and $B_{mod}$ is representative of the isotropic, incoherent noise.

Clearly, this will not hold if the coil itself is sufficiently resistive (perhaps because of its complexity) that the noise voltage arising in the coil dominates that coupled from the rest of the world.

The following receiver coils have been investigated:

1. A hoop of radius 45 mm in the XY plane (ie coupling to the Z component of the NMR signal). This is the familiar geometry, and it couples with the transmitter coil.
2. Rectangular coils, lying in the XZ plane (coupling to the Y component of the NMR signal) 90 mm wide in the X-direction and
   a) 60 mm,
   b) 100 mm,
   c) 200 mm high.
3. The transmitter coil described above.

The following ratio of integrals was obtained:

| | |
|---|---|
| 1: hoop in XY plane | 0.031 |
| 2a: 60 mm rectangle in XZ plane | 0.019 |
| 2b: 100 mm rectangle in XZ plane | 0.019 |
| 2c: 200 mm rectangle in XZ plane | 0.017 |
| 3: screened transmitter coil | 0.007 |

These values assume that all the coils can be made sufficiently directional that signals are only received from within ±90° of the forward direction. It is envisaged that the receiver coils can be screened in a similar way to the transmitter. This might be slightly easier to achieve in the case of the XZ plane coils.

It can be seen that the receiver coil, designed to produce a uniform $B_1$ field, is a factor 3 worse than the real receiver coils. The coil in the XY plane seems to offer the most sensitivity, but this advantage might be outweighed by the possible additional difficulties inherent in decoupling transmitter and receiver (e.g. power loss in diodes). Of the XZ plane receiver coils, as is to be expected, they should be not much longer than the height of the sensitive volume.

Figure 32:
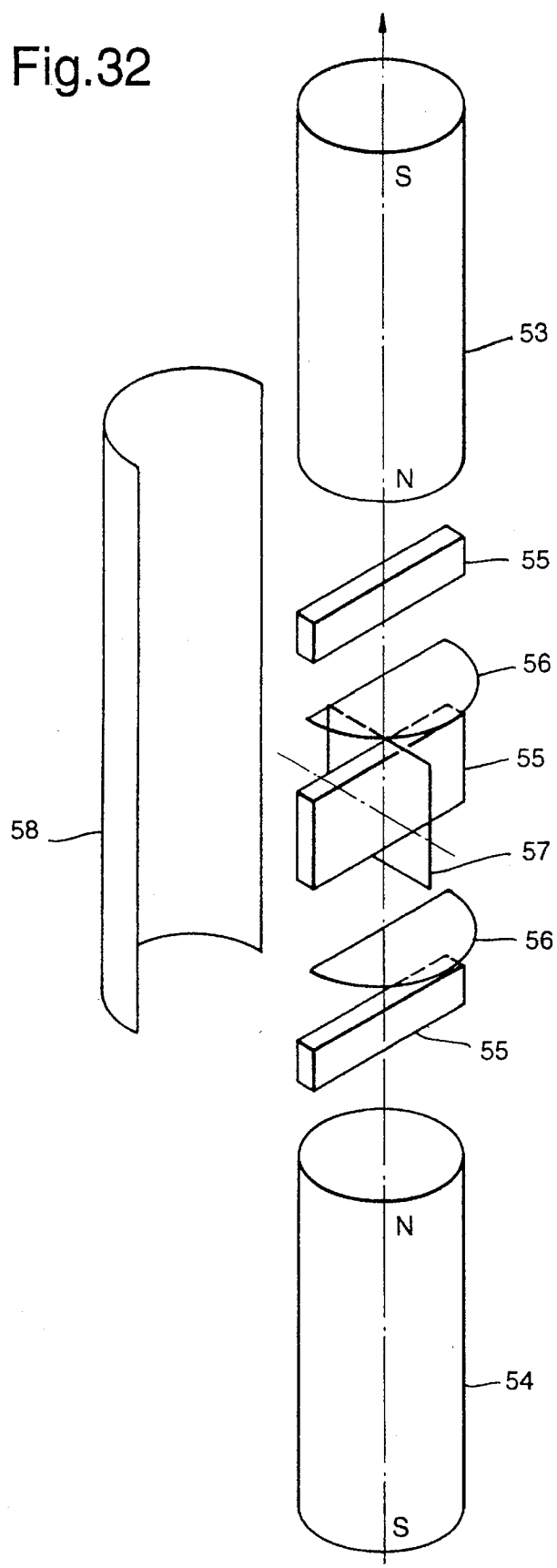
FIG. 32 is a diagram of an alternative magnetic assembly in accordance with a preferred embodiment of the present invention.

FIG. 32 is a view similar to FIG. 31 but illustrating an alternative arrangement in which upper and lower permanent magnets 53,54 are provided aligned along a Z axis. Compensating, permanent magnets 55 are positioned in the space between the magnets 53,54 in alignment with the Z-axis. A pair of RF transmitter coils 56 are positioned above and below the central compensating magnet 55 while a receiver RF coil 57 is arranged about the central compensating magnet 55. In addition, a magnetic shield 58 having a semi-cylindrical form is positioned behind the magnets 53,54,55.

I claim:

1. A magnet assembly comprising a pair of substantially aligned, spaced apart first magnets having like poles facing each other; and at least one second magnet positioned adjacent the space between the first magnets, the at least one second magnet being laterally offset from the alignment axis of the first magnet and being arranged asymmetrically with respect to said alignment axis, the at least one second magnet having a magnetic axis transverse to the alignment axis of the first magnet; whereby a magnetic field of sufficient homogeneity to perform a nuclear magnetic resonance (NMR) process is generated in a working region laterally offset from the first and second magnets, the magnetic field being asymmetrically positioned with respect to the alignment axis of the first magnets.

2. An assembly according to claim 1, wherein the magnets comprise permanent magnets.

3. An assembly according to claim 1, wherein the boundary of the working region nearest to the magnet assembly is spaced by more than substantially 10 cm from the alignment axis of the first magnets.

4. An assembly according to claim 1, wherein the working region has a lateral dimension in a plane orthogonal to the alignment axis of the first magnets of at least 10 cm.

5. An assembly according to claim 1, wherein the second magnet comprises a single magnet.

6. An assembly according to claim 1, wherein the magnets comprise permanent magnets.

7. An assembly according to claim 1, wherein the boundary of the working region nearest to the magnet assembly is spaced by more than substantially 10 cm from the alignment axis of the first magnets.

8. An assembly according to claim 1, wherein the working region has a lateral dimension in a plane orthogonal to the alignment axis of the first magnets of at least 10 cm.

9. An assembly according to claim 1, further comprising a magnetic shield positioned behind the second magnet relative to the working region.

10. An assembly according to claim 1, further comprising a magnetic shield positioned behind the second magnet relative to the working region.

11. An assembly according to claim 10, wherein the shield has a semi-cylindrical form.

12. An assembly according to claim 1, wherein the second magnet comprises a single magnet.

13. An assembly according to claim 12, wherein the magnets comprise permanent magnets.

14. An assembly according to claim 12, wherein the boundary of the working region nearest to the magnet assembly is spaced by more than substantially 10 cm from the alignment axis of the first magnets.

15. An assembly according to claim 12, wherein the working region has a lateral dimension in a plane orthogonal to the alignment axis of the first magnets of at least 10 cm.

16. An assembly according to claim 12, wherein the working region has a lateral dimension in a plane orthogonal to the alignment axis of the first magnets of at least 10 cm.

17. A nuclear magnetic resonance probe comprising: a magnet assembly with a pair of substantially aligned, spaced apart first magnets having like poles facing each other and at least one second magnet positioned adjacent the space between the first magnets, the at least one second magnet having a magnetic axis transverse to the alignment axis of the first magnets, the at least one second magnet being laterally offset from the alignment axis of the first magnets and being arranged asymmetrically with respect to an alignment axis of the first magnets whereby a magnetic field of sufficient homogeneity to perform a nuclear magnetic resonance (NMR) process is generated in a working region laterally offset from the first and second magnets, the magnetic field being asymmetrically positioned with respect to the alignment axis of the first magnets and a RF magnetic field generator for generating a substantially homogeneous RF magnetic field within the working region.

18. A probe according to claim 17, wherein the RF magnetic field generator comprises a pair of substantially rectangular coils substantially symmetrically spaced apart about a plane orthogonal to the alignment axis of the first magnets and with their major surfaces facing towards the working region.

19. A probe according to claim 17, wherein the RF magnetic field generator comprises a pair of semi-circular RF transmitter coils positioned substantially symmetrically about a plane orthogonal to the alignment axis of the first magnets and with circular arc portions facing towards the working region.

* * * * *